(12) United States Patent
Swart

(10) Patent No.: US 6,268,719 B1
(45) Date of Patent: Jul. 31, 2001

(54) PRINTED CIRCUIT BOARD TEST APPARATUS

(75) Inventor: Mark A. Swart, Anaheim Hills, CA (US)

(73) Assignee: Delaware Capital Formation, Inc., Wilmington, DE (US)

( * ) Notice: Subject to any disclaimer, the term of this patent is extended or adjusted under 35 U.S.C. 154(b) by 0 days.

(21) Appl. No.: 09/496,878

(22) Filed: Feb. 2, 2000

Related U.S. Application Data

(63) Continuation-in-part of application No. 09/235,041, filed on Jan. 21, 1999, which is a continuation-in-part of application No. 09/158,823, filed on Sep. 23, 1998, now abandoned.

(51) Int. Cl.[7] .................................................... G01R 1/04
(52) U.S. Cl. ...................... 324/158.1; 324/761; 324/752
(58) Field of Search .................................... 324/750, 751, 324/752, 765, 530–538, 158.1, 501; 439/482; 438/14–18; 257/40, 48

(56) References Cited

U.S. PATENT DOCUMENTS

| | | | |
|---|---|---|---|
| 4,970,461 | * 11/1990 | LePage | 324/752 |
| 5,113,133 | 5/1992 | Conti et al. | 324/158 |
| 5,124,660 | * 6/1992 | Cilingiroglu | 324/538 |
| 5,202,623 | * 4/1993 | LePage | 324/501 |
| 5,268,645 | * 12/1993 | Prokioff et al. | 324/537 |
| 5,369,431 | 11/1994 | Levy et al. | 348/126 |
| 5,469,064 | * 11/1995 | Kerschner et al. | 324/537 |
| 5,508,627 | * 4/1996 | Patterson | 324/752 |
| 5,587,664 | * 12/1996 | Banitt et al. | 324/752 |
| 5,771,144 | 6/1998 | Kim | 360/137 |
| 5,773,988 | 6/1998 | Sayre et al. | 324/761 |

FOREIGN PATENT DOCUMENTS

| | | |
|---|---|---|
| 0731360A2 | 9/1996 | (EP) . |
| 2265224A | 9/1993 | (GB) . |
| 61-274278 | 12/1986 | (JP) . |
| 62-285072 | 12/1987 | (JP) . |
| 2-130483 | 5/1990 | (JP) . |
| 3-152481 | 6/1991 | (JP) . |
| 4-259862 | 9/1992 | (JP) . |
| 7-92227 | 4/1995 | (JP) . |
| 8-15361 | 1/1996 | (JP) . |

OTHER PUBLICATIONS

Japanese Patent Abstract; Publication No. 02259478; Publication Date 1990; 1 Page.

* cited by examiner

Primary Examiner—Vinh P. Nguyen
(74) Attorney, Agent, or Firm—Christie, Parker & Hale, LLP

(57) ABSTRACT

A scan tester for printed circuit boards capable of testing densely spaced test locations on the circuit board including a desk top robot having a test head positioned over the circuit board and movable in a three-dimensional plane. The test head includes a non-contact energy source such as a source of plasma located at an end of the test head for energizing the test locations of the printed circuit board. The printed circuit board is mounted on a test fixture having a plurality of translator plates and translator pins for contacting a second surface of the printed circuit board to translate test signals to an electronic test analyzer.

4 Claims, 13 Drawing Sheets

PRINTED CIRCUIT BOARD TEST APPARATUS

CROSS-REFERENCE TO RELATED APPLICATIONS

This application is a continuation-in-part of application Ser. No. 09/235,041, filed Jan. 21, 1999; which is a continuation-in-part of application Ser. No. 09/158,823, filed Sep. 23, 1998 (now abondoned); which are incorporated herein by reference.

FIELD OF THE INVENTION

This invention relates to the automatic testing of printed circuit boards, and more particularly, to a scan testing machine for testing densely arranged test sites on a surface of a printed circuit board through the use of plasma gas directed across the surface of the printed circuit board in contact with the test sites to energize the circuit and produce test signals.

BACKGROUND OF THE INVENTION

Automatic test equipment for checking printed circuit boards has long involved use of a "bed of nails" test fixture in which the circuit board is mounted during testing. This test fixture includes a large number of nail-like spring-loaded test probes arranged to make electrical contact under spring pressure with designated test points on the circuit board under test, also referred to as the unit under test or "UUT." Any particular circuit laid out on a printed circuit board is likely to be different from other circuits, and consequently, the bed of nails arrangement for contacting test points in the board must be customized for that particular circuit board. When the circuit to be tested is designed, a pattern of test points to be used in checking it is selected, and a corresponding array of test probes is configured in the test fixture. This typically involves drilling a pattern of holes in a probe plate to match the customized array of test probes and then mounting the test probes in the drilled holes on the probe plate. The circuit board is then mounted in the fixture superimposed on the array of test probes. During testing, the spring-loaded probes are brought into spring-pressure contact with the test points on the circuit board under test. Electrical test signals are then transferred from the board to the test probes and then to the exterior of the fixture for communication with a high-speed electronic test analyzer which detects continuity or lack of continuity between various test points in the circuits on the board.

Various approaches have been used in the past for bringing the test probes and the circuit board under test into pressure contact for testing. One class of these fixtures is a "wired test fixture" in which the test probes are individually wired to separate interface contacts for use in transmitting test signals from the probes to the external electronically controlled test analyzer. These wired test fixtures are often referred to as "vacuum test fixtures" since a vacuum is applied to the interior of the test fixture housing during testing to compress the circuit board into contact with the test probes. Customized wire test fixtures of similar construction also can be made by using mechanical means other than vacuum to apply the spring force necessary for compressing the board into contact with the probes during testing.

The wire-wrapping or other connection of test probes, interface pins and transfer pins for use in a wired test fixture can be time intensive. However, customized wired test fixtures are particularly useful in testing circuit boards with complex arrangements of test points and low-volume production boards where larger and more complex and expensive electronic test analyzers are not practical.

As mentioned previously, the customized wired test fixtures are one class of fixtures for transmitting signals from the fixture to the external circuit tester. A further class of test fixtures is the so-called "dedicated" test fixtures, also known as a "grid-type fixture," in which the random pattern of test points on the board are contacted by translator pins which transfer test signals to interface pins arranged in a grid pattern in a receiver. In these grid-type testers, fixturing is generally less complex and simpler than in the customized wired test fixtures.

A typical dedicated or grid fixture contains test electronics with a huge number of switches connecting test probes in a grid base to corresponding test circuits in the electronic test analyzer. In one embodiment of a grid tester as many as 40,000 switches are used. When testing a bare board on such a tester, a translator fixture supports translator pins that communicate between a grid pattern of test probes in a grid base and an off-grid pattern of test points on the board under test. In one prior art grid fixture so-called "tilt pins" are used as the translator pins. The tilt pins are straight solid pins mounted in corresponding pre-drilled holes in translator plates which are part of the translator fixture. The tilt pins can tilt in various orientations to translate separate test signals from the off-grid random pattern of test points on the board to the grid pattern of test probes in the grid base.

Translator fixtures can be constructed and assembled with a plurality of translator plates made from a plastic material such as Lexan. The translator plates are stacked in the fixture between corresponding sets of spacers aligned with one another vertically to form "stand-offs" spaced apart around the periphery of the fixture. The spacers hold the translator plates in a fixed position spaced apart vertically from one another and reasonably parallel to each other. The translator plates at each level of the fixture have pre-drilled patterns of alignment holes that control the position of each tilt pin in the translator fixture.

Several problems are associated with these types of test fixtures when the test points on the printed circuit board are positioned very closely together and are very thin. Individual test points are commonly referred to as test pads, and a group of test pads are commonly known as a test pack. When the tilt pins contact very thin test pads, the pads can be crushed or bent by the tilt pins. Depending upon the degree of damage to the test pads, and how closely they are positioned, individual pads can be permanently shorted together during testing.

A second problem occurring with these types of test fixtures is the difficulty in achieving accurate test results for a test pack when the pads are very closely spaced. It becomes very difficult to direct a tilt pin to each pad within the pack when the pads are so closely spaced. Slight misalignments of test pins can affect the test results, reducing test accuracy.

A third problem is encountered for packs having a grid density of pads which is greater than the grid density of the test probes, such as when the test pack is formed as a ball grid array (BGA) or a quad flat pack (QFP). In such instances there are not enough translation pins available for testing each test pad and thorough testing of the pack is not possible.

To address these problems a printed circuit board test fixture capable of accurately and safely testing circuit boards having small scale test packs was developed which included a pneumatically actuated shorting plate positioned in the fixture corresponding to the location on the printed circuit board where a group of very closely spaced test points were to be tested. A hole was cut through the upper translator plates corresponding to the dimension of the shorting plate to allow the shorting plate to engage the unit under test. A layer of compliant conductive media was positioned over the upper surface of the shorting plate for electrical connection to the test points. The shorting plate included a snap fitting for attachment to an air cylinder extending downwardly through the layers of translator plates. The air cylinder was attached at the bottom of the fixture by a base plug which snaps into a base receptacle rigidly secured to a lower translator plate of the fixture.

During testing of the unit under test, the air cylinder was energized, raising the shorting plate into contact with the test pack, effectively shorting them together for testing without bending or damaging the test points.

A problem with this method is that since all the test sites are shorted together during testing it can not be determined whether one or more individual test sites within the pack are incorrectly shorted together.

An alternative method for testing densely spaced test packs is with a prober to touch each individual pad within the pack. This method is undesirable due to the extremely time consuming process.

Consequently a need exists for test equipment for testing printed circuit boards having small scale or densely spaced test sites, which accurately, safely and quickly produces the test results.

SUMMARY OF THE INVENTION

The present invention comprises a scan test machine for testing closely spaced test sites on a printed circuit board. The scan test machine comprises a roboticaly controlled wiper brush moved across the top of the test sites to scan the test locations. The scan test machine comprises a desk top assembly robot having a test head positioned over the printed circuit board to be tested. The test head includes the wiper brush which is moved across the surface of the printed circuit board and in contact with the test pads to scan the test sites positioned on the surface of the printed circuit board. The printed circuit board is positioned upon a test fixture located on the base of the assembly robot, the test fixture includes a plurality of test probes for contacting the test sites located on an opposite surface of the printed circuit board. The test signals generated from both the wiper brush and the dedicated fixture are transmitted to an external electronically controlled test analyzer. The wiper brush can also be used in conjunction with a flying prober.

In an alternative embodiment, a conductive roller assembly is positioned adjacent one of the printed circuit board hold down blocks on the test fixture. The roller assembly includes a conductive cloth positioned around a roller which is moved across the surface of the circuit board to transmit test signals from the test sites to the test analyzer.

In a second embodiment, the scan test apparatus of the present invention includes a laser, electron beam or other non-contact energy source positioned over the unit under test to energize the circuit and generate test signals for the test fixture located on the opposite side of the circuit board. Specifically a preferred non-contact energy source is a column of ignited plasma gas.

These and other aspects of the invention will be more fully understood by referring to the following detailed description in the accompanying drawings.

DETAILED DESCRIPTION

Figure 1:
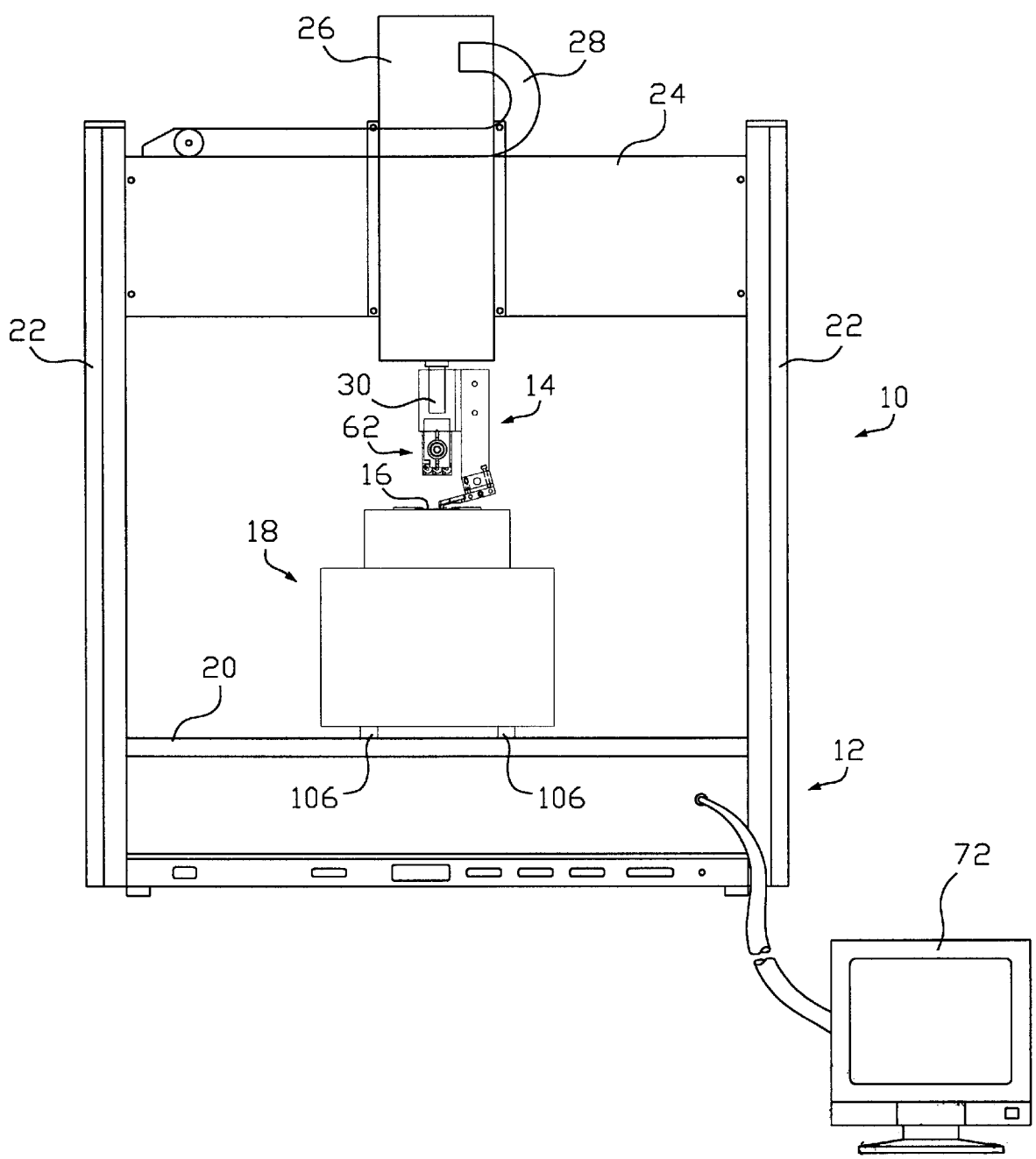
FIG. 1 is a front view of the scan test machine of the present invention.

The scan test machine 10 of the present invention is shown in FIG. 1. The scan test machine comprises a desk top assembly robot 12 having a test head 14 positioned over the printed circuit board to be tested or UUT 16. The UUT is positioned upon a test fixture 18 located upon a base 20 of the robot 12. The robot 12 includes vertical supports 22 connected to each side of the base 20. The vertical supports are connected to either side of the base 20 along tracks (not shown) positioned along the sides of the base such that the vertical supports can move back and forth along the sides of the base. A gantry 24 is rigidly connected between the upper portion of the vertical supports above the base 20. Positioned on the gantry 24 is a robot head 26 which is movable from side to side along the gantry. Power is provided to the robot head through a wiring track 28 connected to the robot head. At the lower end of the robot head is a spindle 30 which can rotate in either direction 360 degrees. The gantry 24 is connected to the vertical supports 22 along tracks (not shown) such that the gantry and the robot head can be moved vertically up and down along the length of the vertical supports. A suitable robot would be a SONY CASTPRO machine.

Figure 2:
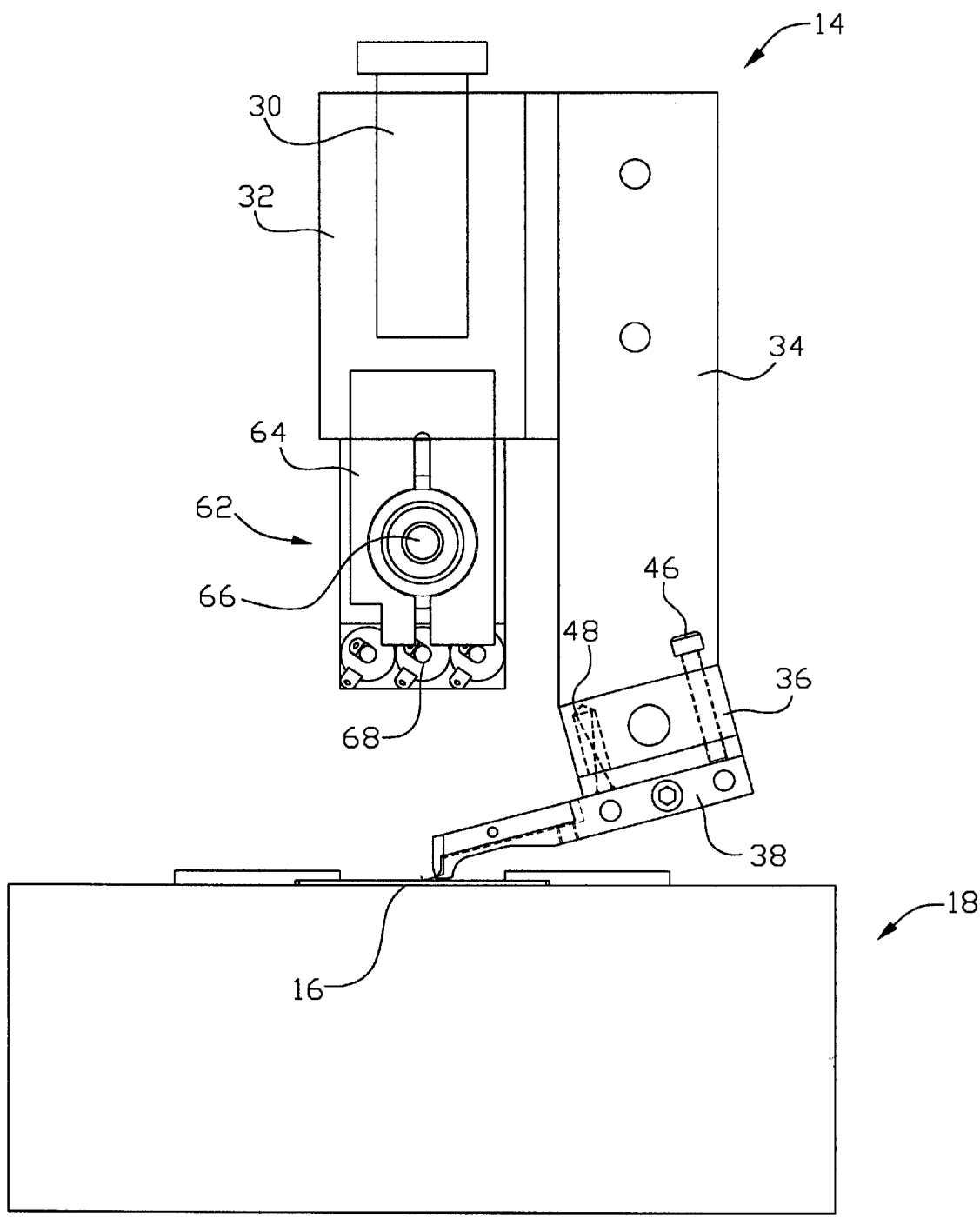
FIG. 2 is a front view of the test head assembly of the scan test machine of FIG. 1.
Figure 3:
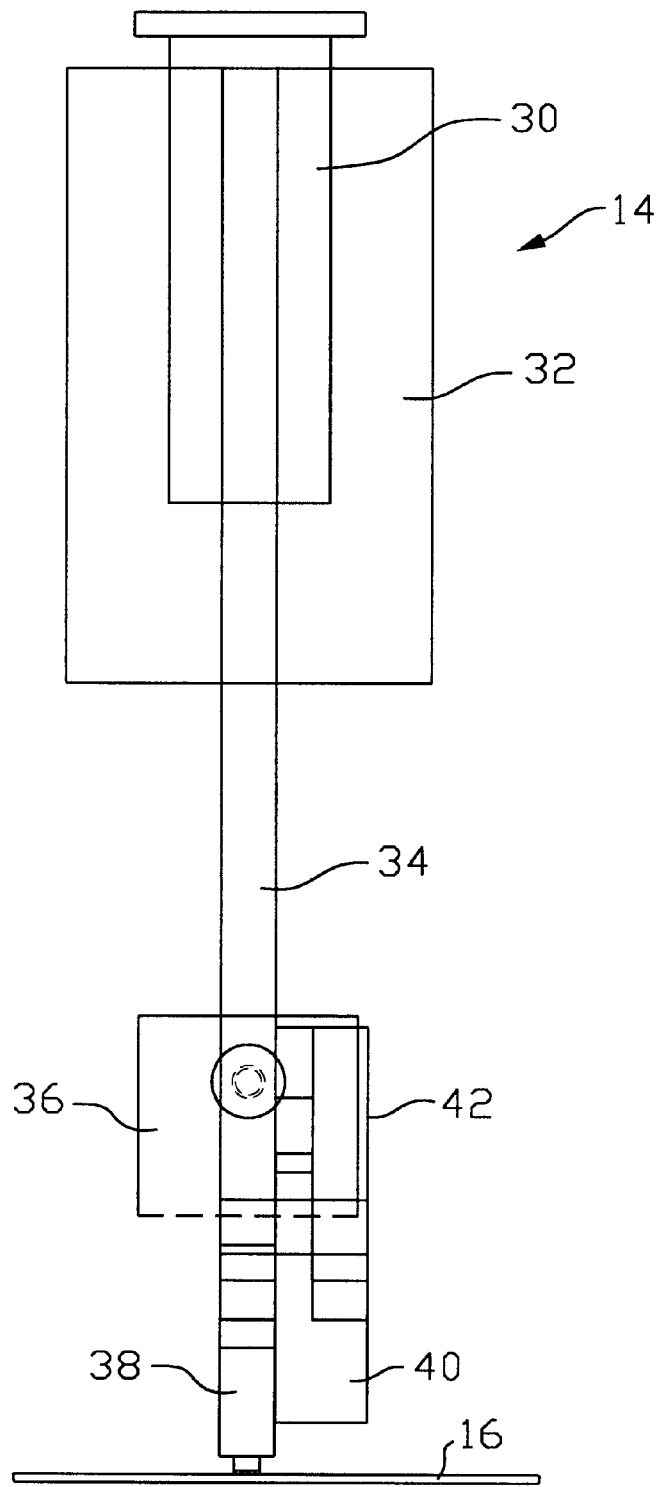
FIG. 3 is a side view of the test head of FIG. 2.
Figure 4:
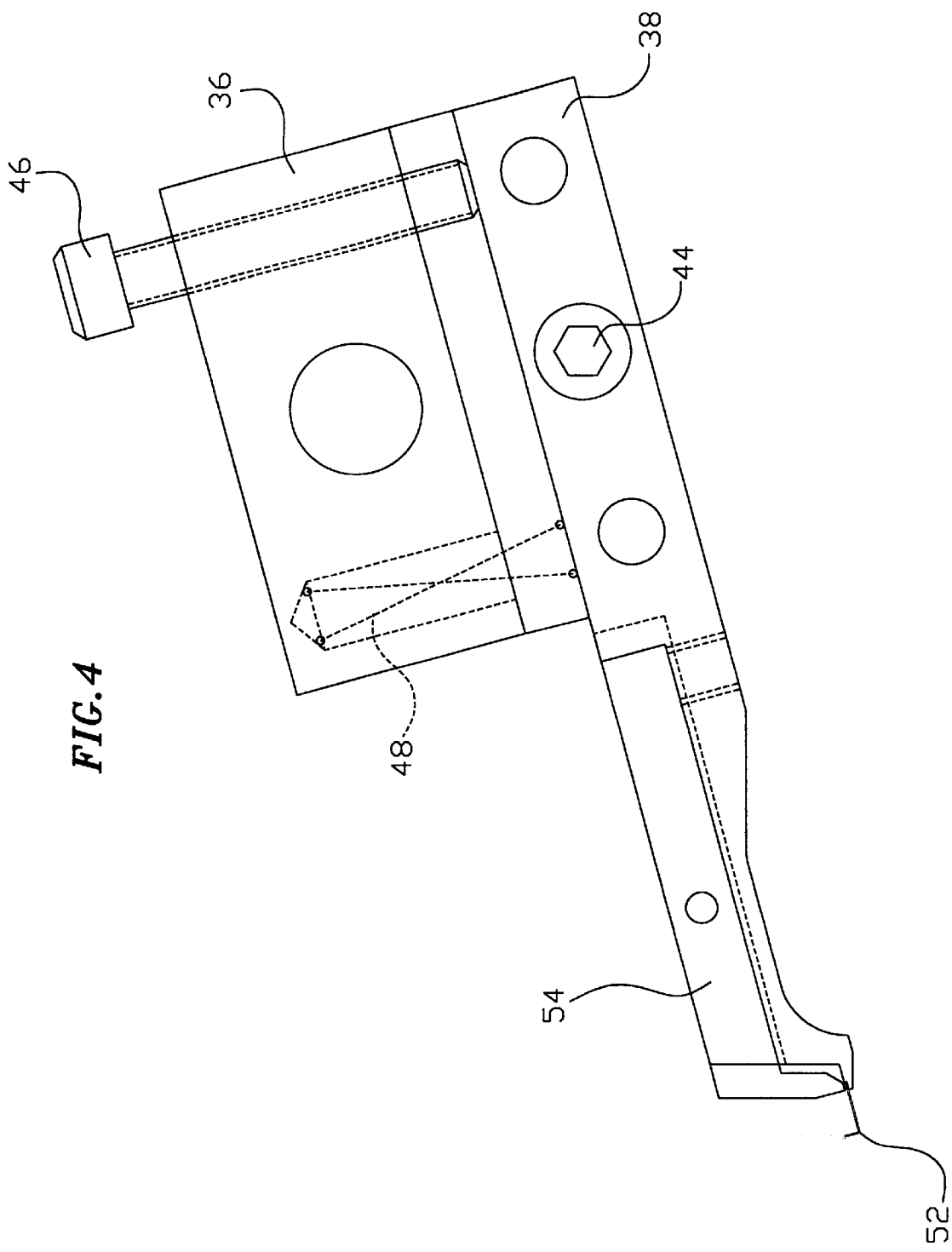
FIG. 4 is a front view of the wiper brush assembly of the test head of FIG. 3.

The test head 14 is connected to the spindle and is shown in more detail in FIGS. 2 and 3. Referring to FIGS. 2 and 3 the test head 14 includes a mounting block 32 fastened to the robot spindle 30. Connected along a side of the mounting block is a support arm 34 which extends downwardly towards the printed circuit board or unit under test 16. Positioned on the lower end of the support arm 34 is an angled mount 36 which is also shown in more detail in FIG. 4. An adjusting arm 38 is positioned below the angled mount 36 and is connected to the angled mount by a flange 40 (see FIG. 3) extending downwardly from the angled mount 36. The flange 40 is rigidly secured along a recess in the side of the angled mount by a plate 42 which clamps the flange 42 to the angled mount 36. The adjusting arm 38 is secured to the lower end of the flange 40 by bolts 44. The angle of the adjusting arm can be adjusted by bolt 46 passing through angled mount 36 and against the upper surface of the adjusting arm. Bolt 46 is adjusted to compress spring 48 also positioned within a channel 50 in mounting block 36 which presses against the upper surface of the adjusting arm 38.

Figure 5:
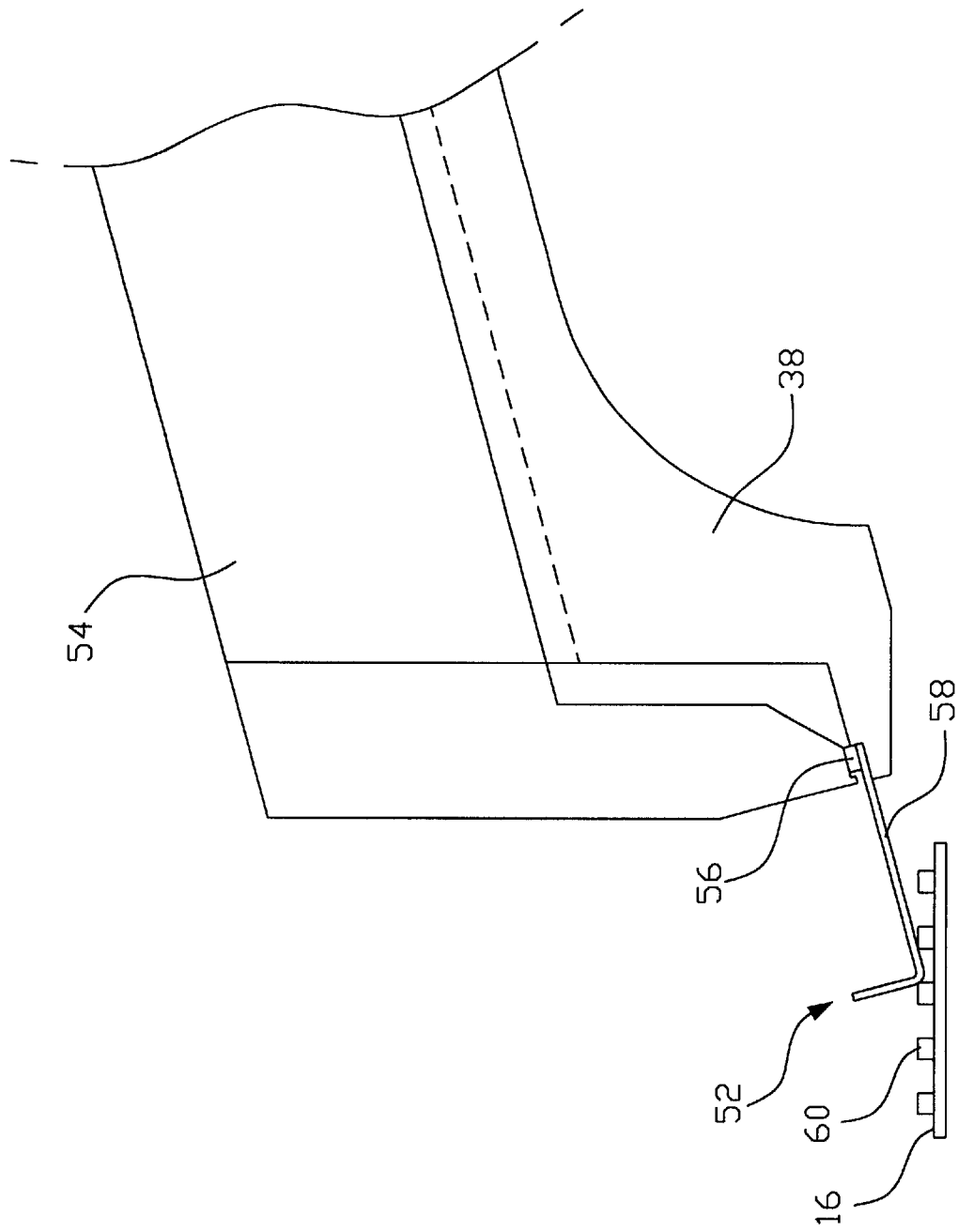
FIG. 5 is an enlarged detail of the wiper brush assembly of FIG. 4.
Figure 6:
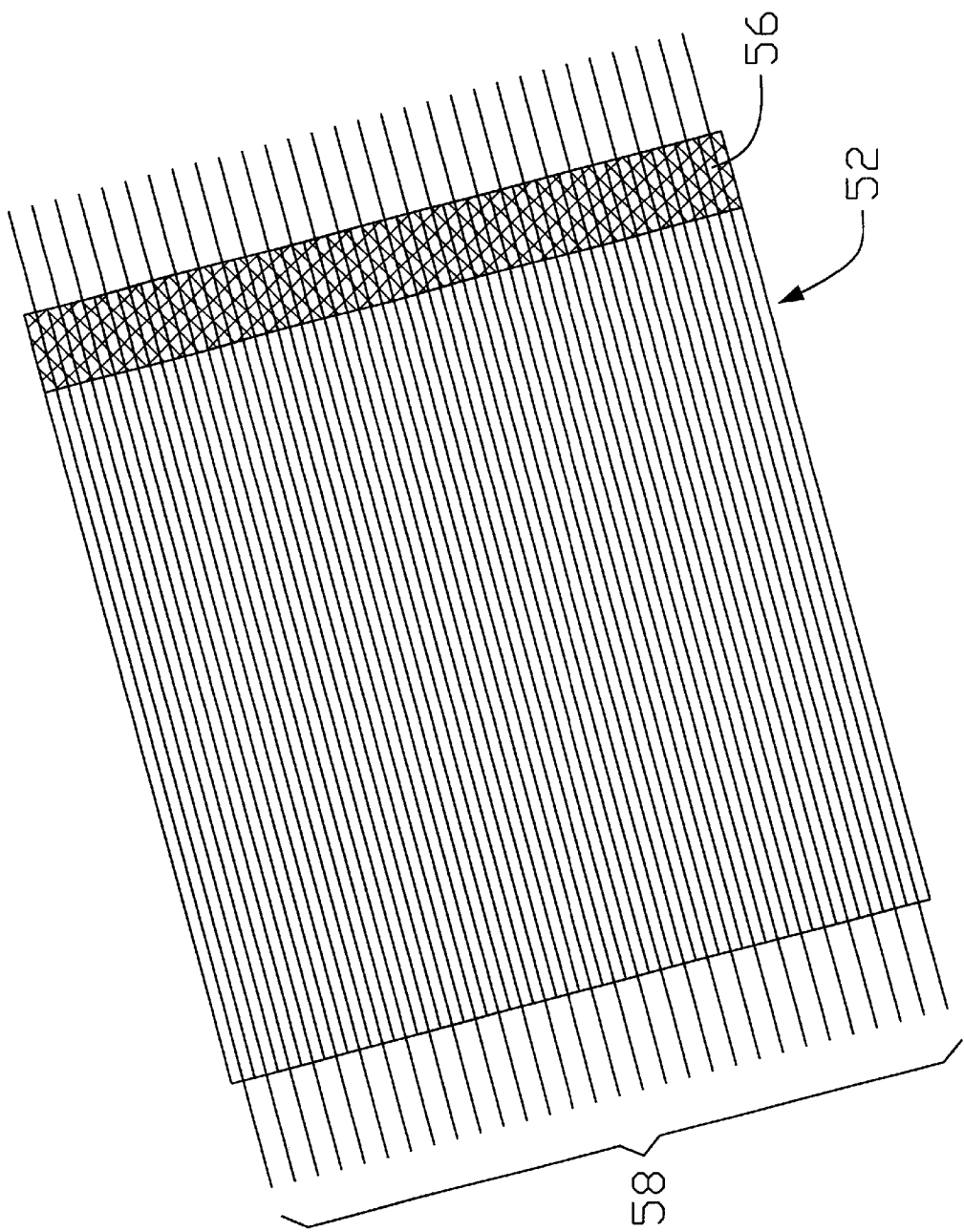
FIG. 6 is a top view of the wiper brush of FIG. 5.

A wiper brush 52 is positioned on the end of the adjusting arm 38 and is held in position by a clamp 54 secured to the upper surface of the adjusting arm as shown best in FIG. 5. The wiper brush 52 is held between the clamp 54 and the adjusting arm 38 by the wiper bar 56 extending across the length of the brush wires 58. As best seen in FIG. 6, the wiper brush 52 includes a plurality of individual brush wires 58 preferably each 0.003 inches in diameter. The plurality of small diameter brush wires have independent compliance with each other, and each wire includes a contact surface smaller than the test pads or sites. The wiper brush can include any desired number of brush wires depending upon the particular requirements for the unit under test. In addition to using a brush, the wiper can be a modified flex circuit, conductive cloth or other compliant conductive material. As discussed in more detail subsequently, the wiper brush is moved across the upper surface of the unit under test 16 such that it contacts in succession the test sites 60 to scan the test signals.

Figure 7:
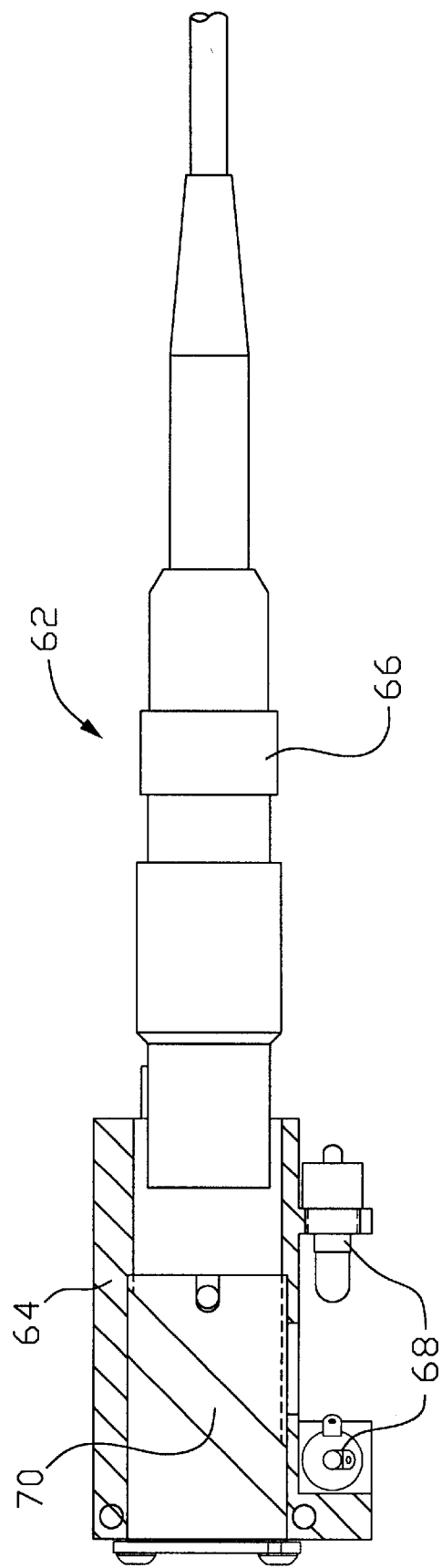
FIG. 7 is a side view of the camera assembly of the test head of FIG. 2.

Referring again to FIGS. 1 and 2 the test head also includes a camera assembly 62 connected to the lower surface of the mounting block 32. As also shown in FIG. 7 the camera assembly 62 includes a housing 64 for clamping the camera 66 to the mounting block 32. The camera is typically a mini CCD camera such as an Elmo 421E. The housing includes lights 68 and a mirror 70 for reflecting the image of the position of the test sites to a computer terminal 72 for viewing the test site location during testing.

Figure 8:
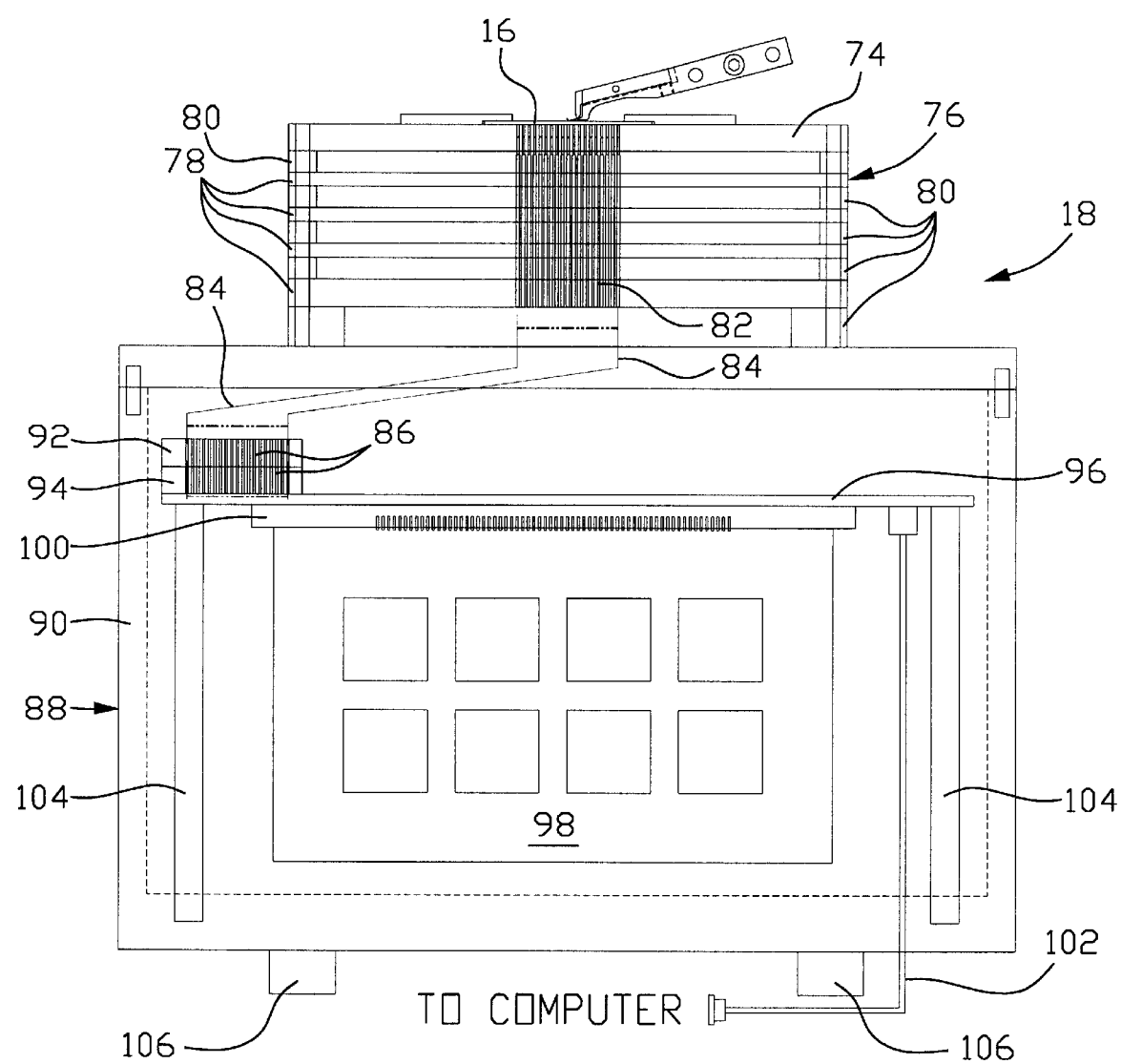
FIG. 8 is a front view of the test fixture of FIG. 1.
Figure 9:
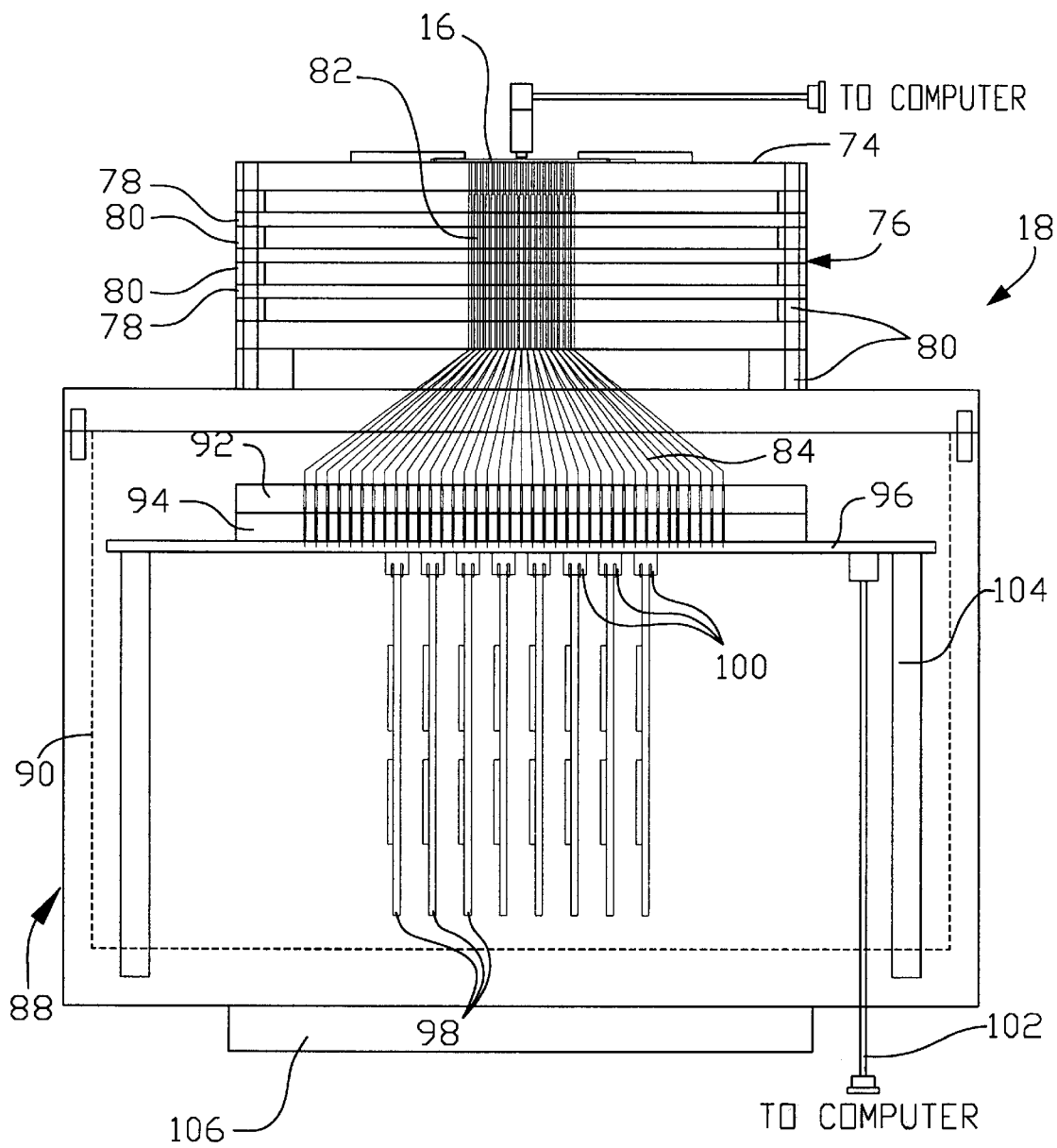
FIG. 9 is a side view of the test fixture of FIG. 8.

As stated earlier, the unit under test 16 is positioned upon a test fixture 18 as shown in more detail in FIGS. 8 and 9. The test fixture shown is a dedicated fixture wherein the unit under test is positioned upon the top plate 74 of a translator fixture 76 which has a plurality of translator plates 78 separated by spacers 80. The translator plates include a plurality of pre-drilled holes which are spaced apart in rows and columns corresponding to the pattern of test sites located on the lower surface of the unit under test. The translator fixture supports a plurality of translator pins or test probes 82 positioned within the pre-drilled holes in the translator plates. Depending upon the particular application, the test probes can be straight solid translator pins or conventional spring probes. Preferably the test probes are conventional spring probes. The test probes extend through the top plate 74 to make contact with test sites located on the bottom surface of the unit under test. The lower end of the test probes have wire wrap tails to accommodate fixture wiring 84 to translate the test signals to the test probes 86 positioned in the lower fixture 88.

The translator fixture can be constructed and assembled with a plurality of translator plates made from plastic material such as Lexan. The translator plates are separated by the spacers 80 which support the translator fixture above the lower fixture 88.

The lower fixture includes a housing 90 which contains additional test electronics. Located within the housing is a terminal block mounted on a second board mounted terminal block 94. Terminal block 92 and board mounted terminal block 94 have a plurality of pre-drilled holes which are aligned to receive test probes 86. Blocks 92 and 94 are positioned upon a switch card circuit board 96. The switch card circuit board includes electrical connections for translation of the test signals through to switch cards 98 connected to the lower surface of the switch card circuit board by edge card connectors 100. The switch cards contain electronics 99 with a number of switches which connect test probes 86 to corresponding test circuits in the external electronic test analyzer (not shown) through conduit 102. The switch card circuit board 96 is supported within housing 90 by vertical supports 104. The entire dedicated fixture 18 is connected to the base 20 of the robot 12 by support blocks 106 attached to the base through tracks (not shown) so that the entire translator fixture can be moved from front to back of the robot along the base.

It is to be understood that although the dedicated fixture is positioned on the robot so that both sides of the unit under test can be tested, it is to be understood that if only one side of the unit under test includes test site locations, the unit under test can be positioned upon a support on the base of the robot and the wiper brush can be used to scan the desired test locations. Alternatively other types of test fixtures can be used to support the unit under test on the base of the robot.

Figure 10:
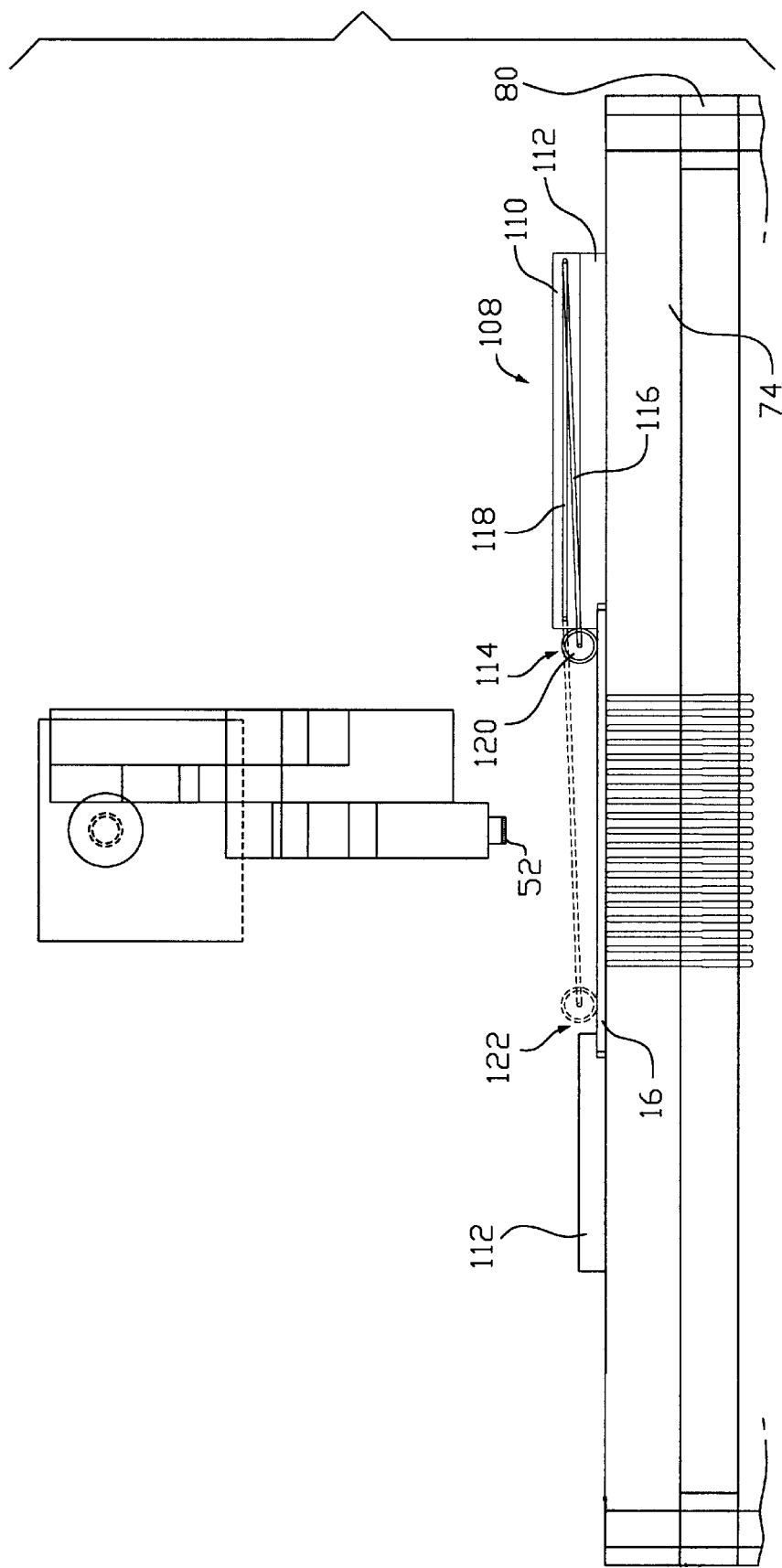
FIG. 10 is a side view detail of the optional roller assembly for,the scan test machine of FIG. 1.

Referring now to FIG. 10, the scan tester of the present invention can also include a conductive roller assembly 108 for transmitting test signals from the test sites to the external test electronics. The conductive roller assembly includes a housing 110 which is positioned on a unit under test hold down block 112. The housing contains a linear motor or a pneumatic actuator (not shown) for moving back and forth the conductive roller 114. The roller has a layer of conductive material, such as cloth or rubber, to transmit the test signals. The conductive roller is attached to fingers 116 which is connected to the linear motor or pneumatic actuator. The fingers 116 extend into the housing 110 through a slot 118 located along the side of the housing so that the finger can be moved back and forth across the surface of the unit under test. The conductive roller is wired in parallel with the wiper brush and can be used in conjunction with or separately from the wiper brush to transmit the test signals. The conductive roller is shown in both its retracted position 120 and its extended position 122.

In use the robot moves the test head into position such that the wiper brush successively contacts the test sites on the unit under test to transmit test signals to the external test electronics. Test signals from the test sites on the lower surface of the unit under test are transmitted through the dedicated fixture to the external test electronics. In addition test signals can also be transmitted through the conductive roller to the external test electronics. The movements of the test head by the robot are controlled through software programmed for the particular test site pattern on the unit under test. The wiper brush provides for the testing of closely spaced test sites quickly by individually contacting each test location if desired.

Figure 11:
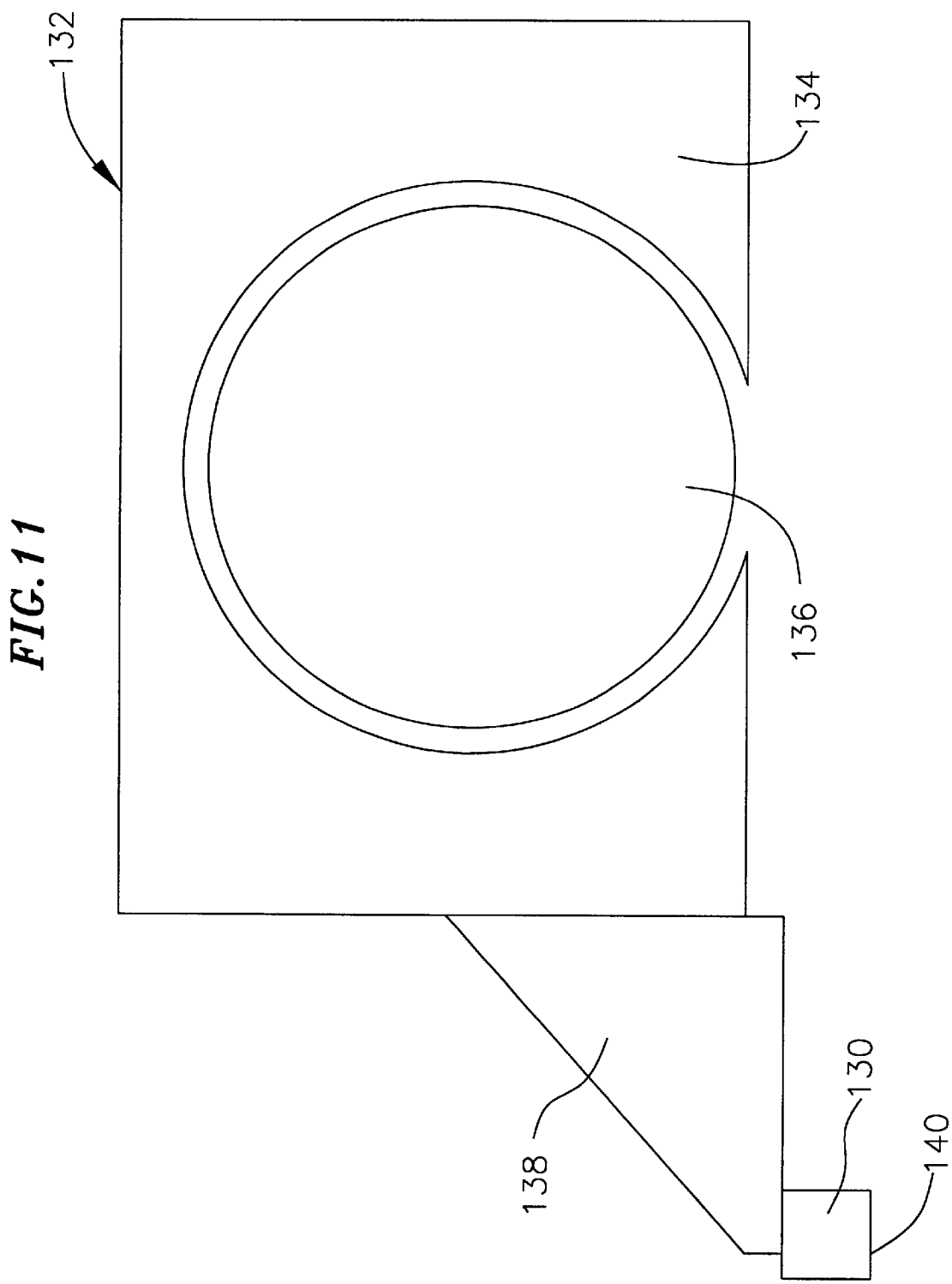
FIG. 11 is a schematic side view of the wiper brush assembly in combination with a flying prober.

FIG. 11 illustrates the wiper assembly 130 in combination with a flying prober 132. Flying prober 132 includes a body portion 134 positioned on a rod 136 and arm 138 extending from the body portion for supporting the wiper assembly 130. The flying prober is a conventional prober which moves in the x, y and z directions as well as being capable of rotating to move the wiper brush 140 across test sites.

Figure 12:
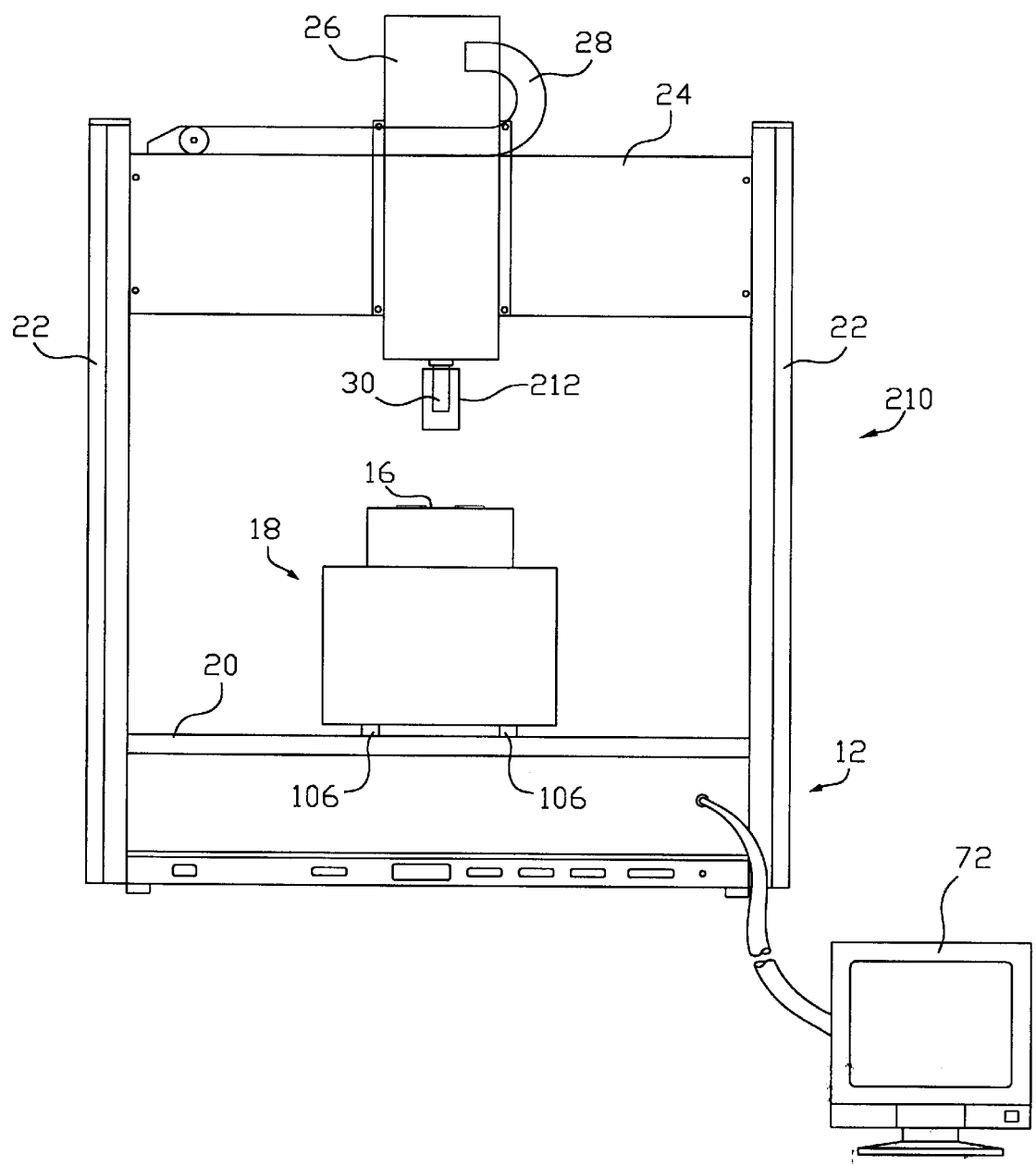
FIG. 12 is a front view of the scan test machine of the present invention incorporating a non-contact energy source.

FIG. 12 illustrates a preferred embodiment scan test machine 210 of the present invention. The scan test machine 210 comprises a desk top assembly robot 12 as shown and described with respect to FIG. 1. The robot 12 includes a non-contact energy source 212 attached to the spindle 30 of the robot. The non-contact energy source 212 can be a laser that produces optical radiation using a population inversion to provide light amplification by stimulated emission of radiation and an optical resonant cavity to provide positive feed back or an electron gun which comprises an electrode structure that produces and controls an electron beam. Other energy producing non-contact devices are also contemplated. The non-contact energy source 212 is positioned over the unit under test 16 and directs the laser beam or electron beam onto the unit under test to energize the circuit on the unit under test.

Figure 13:
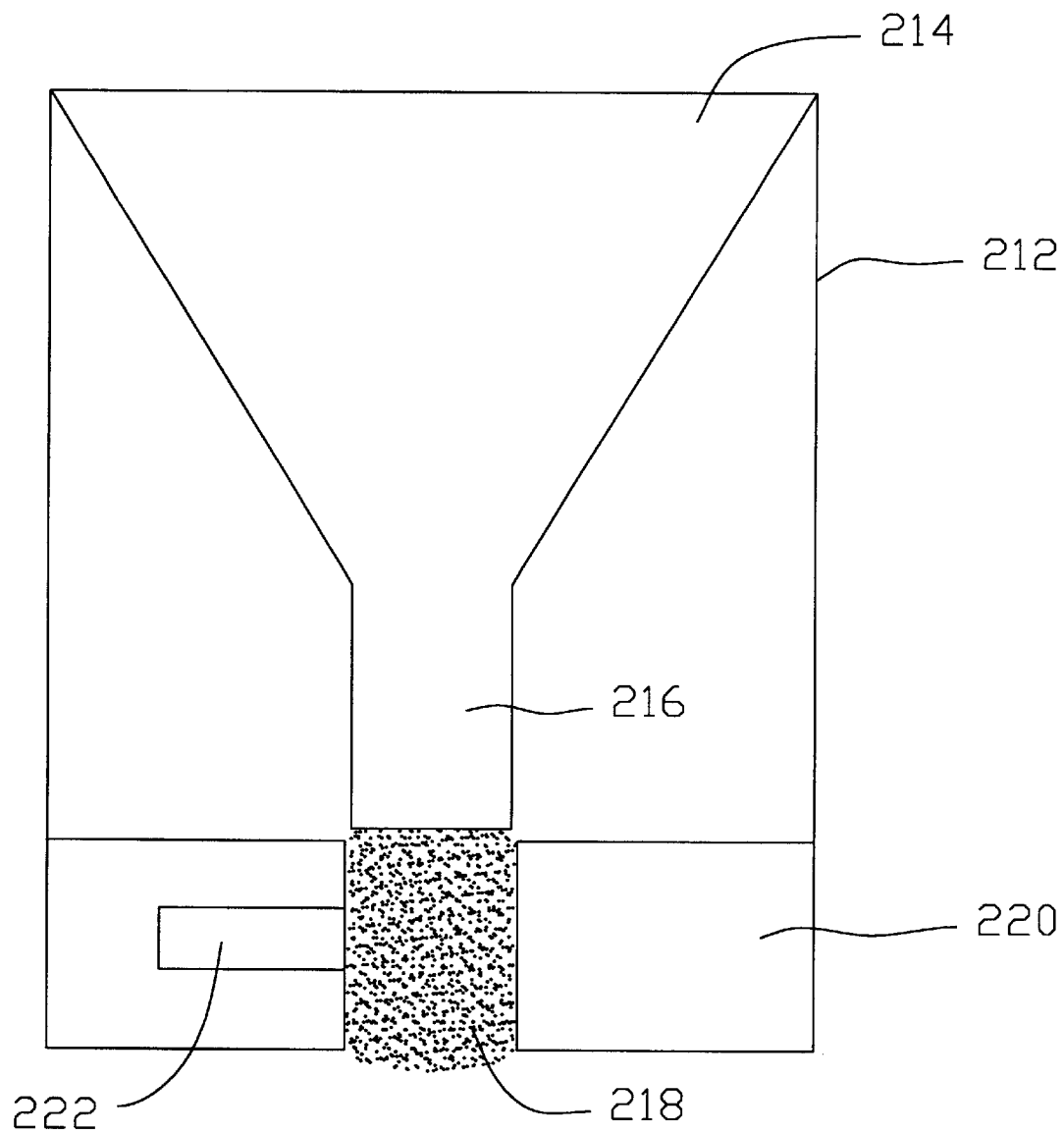
FIG. 13 is a detail view of the non-contact energy source of FIG. 12 including a plasma source.

A preferred non-contact energy source 212 is plasma. As shown in FIG. 13, source 212 includes a reservoir 214 of plasma. The plasma is fed to a nozzle 216 which directs a column 218 of plasma gas through a plate 220. The column of plasma gas is ignited by an ignitor 222 to energize the unit under test. With the unit under test energized, the test probes 82 located in the test fixture 18 translate test signals to the external test electronics as discussed in detail in reference to FIGS. 8 and 9.

Although the present invention has been described and is illustrated with respect to a preferred embodiment thereof, it is to be understood that it is not to be so limited, since changes and modifications may be made therein which are within the full intended scope of this invention as hereinafter claimed.

What is claimed is:

1. A tester for a printed circuit board having a circuit containing test sites comprising:

a translator fixture for mounting the printed circuit board having a plurality of translator pins; and a test head mounted above the fixture including a plasma non-contact energy source for energizing the circuit on the circuit board and transmitting test signals through the translator pins to test electronics, wherein said energy source comprises: plasma reservoir, a nozzle connected to the plasma reservoir for delivering a column of plasma gas and an ignitor for igniting the plasma gas.

2. The tester of claim 1 further comprising a robot connected to a test head to move the test head in a three-dimensional plane.

3. The tester of claim 1 wherein the translator fixture includes a plurality of essentially parallel and vertically spaced apart translator plates having selected patterns of holes aligned in the translator plates for containing and supporting the translator pins for contacting the test sites on the circuit board.

4. The tester of claim 2 wherein the test head is mounted on a spindle of the robot, and the plasma source is positioned on the spindle for directing an ignited column of plasma gas at the circuit board.

* * * * *